US010401425B2

(12) United States Patent
Fu

(10) Patent No.: US 10,401,425 B2
(45) Date of Patent: Sep. 3, 2019

(54) TURRET HANDLER WITH PICKER PAIRS

(71) Applicant: Winbond Electronics Corp., Taichung (TW)

(72) Inventor: Ting-Ming Fu, Xinfeng Township, Hsinchu County (TW)

(73) Assignee: WINBOND ELECTRONICS CORP., Taichung (TW)

(*) Notice: Subject to any disclaimer, the term of this patent is extended or adjusted under 35 U.S.C. 154(b) by 87 days.

(21) Appl. No.: 15/871,547

(22) Filed: Jan. 15, 2018

(65) Prior Publication Data

US 2018/0238960 A1 Aug. 23, 2018

(30) Foreign Application Priority Data

Feb. 23, 2017 (CN) .......................... 2017 1 0098099

(51) Int. Cl.
*G01R 31/20* (2006.01)
*G01R 31/28* (2006.01)
*G01R 1/04* (2006.01)
*G01R 31/01* (2006.01)

(52) U.S. Cl.
CPC ....... *G01R 31/2893* (2013.01); *G01R 1/0433* (2013.01); *G01R 31/01* (2013.01); *G01R 31/2867* (2013.01); *G01R 31/2887* (2013.01); *G01R 31/2862* (2013.01); *G01R 31/2868* (2013.01)

(58) Field of Classification Search
CPC ....................... G01R 31/2893; G01R 31/2867; G01R 31/01; G01R 31/2887; G01R 31/2868; G01R 31/2862; G01R 31/2891
USPC ......... 324/71, 378, 403, 415, 425, 500, 537, 324/750.13, 757.01
See application file for complete search history.

(56) References Cited

U.S. PATENT DOCUMENTS

2009/0053018 A1* 2/2009 Lee .................... G01R 31/2893 414/222.01
2014/0239998 A1 8/2014 Long et al.
2016/0109512 A1* 4/2016 Kim .................. G01R 31/2893 324/750.2
2018/0210028 A1* 7/2018 Fu ...................... G01R 31/2893

* cited by examiner

*Primary Examiner* — Jermele M Hollington
*Assistant Examiner* — Raul J Rios Russo
(74) *Attorney, Agent, or Firm* — Muncy, Geissler, Olds & Lowe, P.C.

(57) ABSTRACT

A turret handler with picker pairs is provided for testing a plurality of electronic elements. The turret handler includes a plurality of outer pickers, a plurality of inner pickers, a plurality of sockets and a package carrier. The outer pickers travel along a first circular path. The inner pickers travel along a second circular path. The first circular path and the second circular path are concentric circles, and the outer pickers and the inner pickers are arranged side by side along the radial direction of the first circular path. The sockets include a plurality of first sockets and a plurality of second sockets. The first sockets circumferentially correspond to the first circular path, the second sockets circumferentially correspond to the second circular path, and each first socket corresponds to one second socket along the radial direction. The package carrier includes a plurality of recesses.

11 Claims, 8 Drawing Sheets

TURRET HANDLER WITH PICKER PAIRS

CROSS REFERENCE TO RELATED APPLICATIONS

This Application claims priority of China Patent Application No. 201710098099.7, filed on Feb. 23, 2017, the entirety of which is incorporated by reference herein.

BACKGROUND OF THE INVENTION

Field of the Invention

The present invention relates to a turret handler with picker pairs, and in particular to a turret handler with increased test efficiency.

Description of the Related Art

In a conventional turret handler, the turret has a main plate with a plurality of pickers. To increase the number of electronic elements that can be tested in one single test procedure, the diameter of the main plate is increased to increase the number of pickers. However, the increased number of pickers increases the weight of the main plate, and inertia is generated by high-speed rotation. If the rotation speed is decreased to prevent the inertia problem, the index time is increased, and the time and cost of the test procedure is therefore increased.

BRIEF SUMMARY OF THE INVENTION

In one embodiment, a turret handler with picker pairs, for testing a plurality of electronic elements is provided. The turret handler includes a plurality of picker pairs, a plurality of sockets and a package carrier. The plurality of picker pairs are configured with a plurality of outer pickers and a plurality of inner pickers, wherein the plurality of outer pickers travel along a first circular path and the plurality of inner pickers travel along a second circular path, and each picker pair includes an outer picker and an inner picker arranged side by side along a radial direction of the first circular path. The plurality of sockets comprise a plurality of first sockets and a plurality of second sockets, wherein the first sockets circumferentially correspond to the first circular path, the second sockets circumferentially correspond to the second circular path, each first socket corresponds to one second socket along the radial direction, the electronic elements are moved to the first sockets by the outer pickers to be tested, and the electronic elements are moved to the second sockets by the inner pickers to be tested. The package carrier comprises a plurality of recesses, wherein one picker pair in the placement positions puts qualified electronic elements in the recesses, wherein the first circular path and the second circular path are concentric circles.

In one embodiment, the recesses comprise a first recess, a second recess, a third recess and a fourth recess, which are sequentially arranged on the package carrier, and in a first state, the first and the third recess are in placement positions, a first outer picker puts one qualified electronic element into the first recess, a first inner picker puts one qualified electronic element into the third recess, and then the package carrier is moved to make the second and the fourth recess in the placement positions, a second outer picker then puts one qualified electronic element into the second recess, and a second inner picker puts one qualified electronic element into the fourth recess.

In one embodiment, the recesses comprise a first recess, a second recess, a third recess, a fourth recess and a fifth recess, which are sequentially arranged on the package carrier, and in a second state, the first and the third recess are in placement positions, a first outer picker puts one qualified electronic element into the first recess, a first inner picker holds one disqualified electronic element, and then the package carrier is moved to make the second and the fourth recess in the placement positions, a second outer picker then puts one qualified electronic element into the second recess, and a second inner picker puts one qualified electronic element into the fourth recess, and then the package carrier is moved to make the third recess and the fifth recess in the placement positions, a third outer picker then puts one qualified electronic element into the third recess, and a third inner picker puts one qualified electronic element into the fifth recess.

In one embodiment, the recesses comprise a first recess, a second recess, a third recess, a fourth recess and a fifth recess, which are sequentially arranged on the package carrier, and in a third state, the first recess is in a placement position and corresponds to the a first inner picker, a first outer picker holds one disqualified electronic element, and the first inner picker puts one qualified electronic element into the first recess, and then the package carrier is moved to make the second and the fourth recess in the placement positions, a second outer picker then puts one qualified electronic element into the second recess, and a second inner picker puts one qualified electronic element into the fourth recess, and then the package carrier is moved to make the third and the fifth recess in the placement positions, a third outer picker then puts one qualified electronic element into the third recess, and a third inner picker puts one qualified electronic element into the fifth recess.

In one embodiment, the recesses comprise a first recess, a second recess, a third recess, a fourth recess, a fifth recess, a sixth recess and a seventh recess, which are sequentially arranged on the package carrier, and in a fourth state, a first outer picker and a first inner picker put qualified electronic elements into the first recess and the third recess, then the package carrier is moved to make the second recess in a placement position, a second outer picker puts one qualified electronic element into the second recess, and a second inner picker holds one disqualified electronic element, and then the package carrier is moved to make the fourth and the sixth recess in the placement positions, a third outer picker then puts one qualified electronic element into the fourth recess, and a third inner picker puts one qualified electronic element into the sixth recess, and then the package carrier is moved to make the fifth and the seven recess in the placement positions, a forth outer picker then puts one qualified electronic element into the fifth recess, and a forth inner picker puts one qualified electronic element into the seven recess.

In one embodiment, the recesses comprise a first recess, a second recess, a third recess, a fourth recess, a fifth recess, a sixth recess and a seventh recess, which are sequentially arranged on the package carrier, and in a fifth state, a first outer picker and a first inner picker put qualified electronic elements into the first recess and the third recess, then the package carrier is moved to make the second recess in a placement position and corresponds to the a second inner picker, the second inner picker puts one qualified electronic element into the second recess, and a second outer picker holds one disqualified electronic element, and then the package carrier is moved to make the fourth and the sixth recess in the placement positions, a third outer picker then puts one qualified electronic element into the fourth recess, and a third inner picker puts one qualified electronic element into the sixth recess, and then the package carrier is moved to make the fifth and the seven recess in the placement positions, a forth outer picker then puts one qualified electronic element into the fifth recess, and a forth inner picker puts one qualified electronic element into the seven recess.

In one embodiment, the turret handler further comprises a marking inspection plate, wherein the marking inspection plate comprises a plurality of first receiving portions and a plurality of second receiving portions, the first receiving portions are circumferentially disposed on the marking inspection plate, the second receiving portions are circumferentially disposed on the marking inspection plate, each first receiving portion radially corresponds to one second receiving portion, the outer pickers and the inner pickers put the non-inspected electronic elements in the first receiving portions and the second receiving portions, and then the outer pickers and the inner pickers move the inspected electronic elements to the first sockets and the second sockets after the marking inspection.

In one embodiment, the turret handler further comprises a feeding unit, wherein the feeding unit comprises a feeding track and a taking portion, the taking portion has a first position and a second position, and the electronic elements are transmitted to the first position and the second position by the feeding trace, and the outer picker and the inner picker pick up the electronic elements from the first position and the second position respectively.

In one embodiment, the feeding unit further comprises a stopper and a spacer, the tacking portion has an initial position, and when one electronic element is in the initial position, the stopper stops the feeding track, and the spacer moves the electronic element to the first position or the second position.

In one embodiment, a socket gap is formed between the radially arranged first socket and second socket, and a recess gap is formed between the neighboring recesses, and the socket gap is twice as large as the recess gap.

In one embodiment, the turret handler further comprises a transmission plate, the outer pickers and the inner pickers are disposed on the transmission plate, the transmission plate moves the outer pickers along the first circular path, and the transmission plate moves the inner pickers along the second circular path.

Utilizing the radially arranged pickers and the radially arranged sockets of the turret handler of the embodiment of the invention, the number of pickers and sockets are increased without substantially changing the design of the turret handler, and the test efficiency of the turret handler is improved. Utilizing the method for placing the electronic elements into the recesses mentioned above, even though one picker holds disqualified electronic element, the radially arranged pickers can smoothly place the qualified electronic elements into the recesses of the package carrier.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
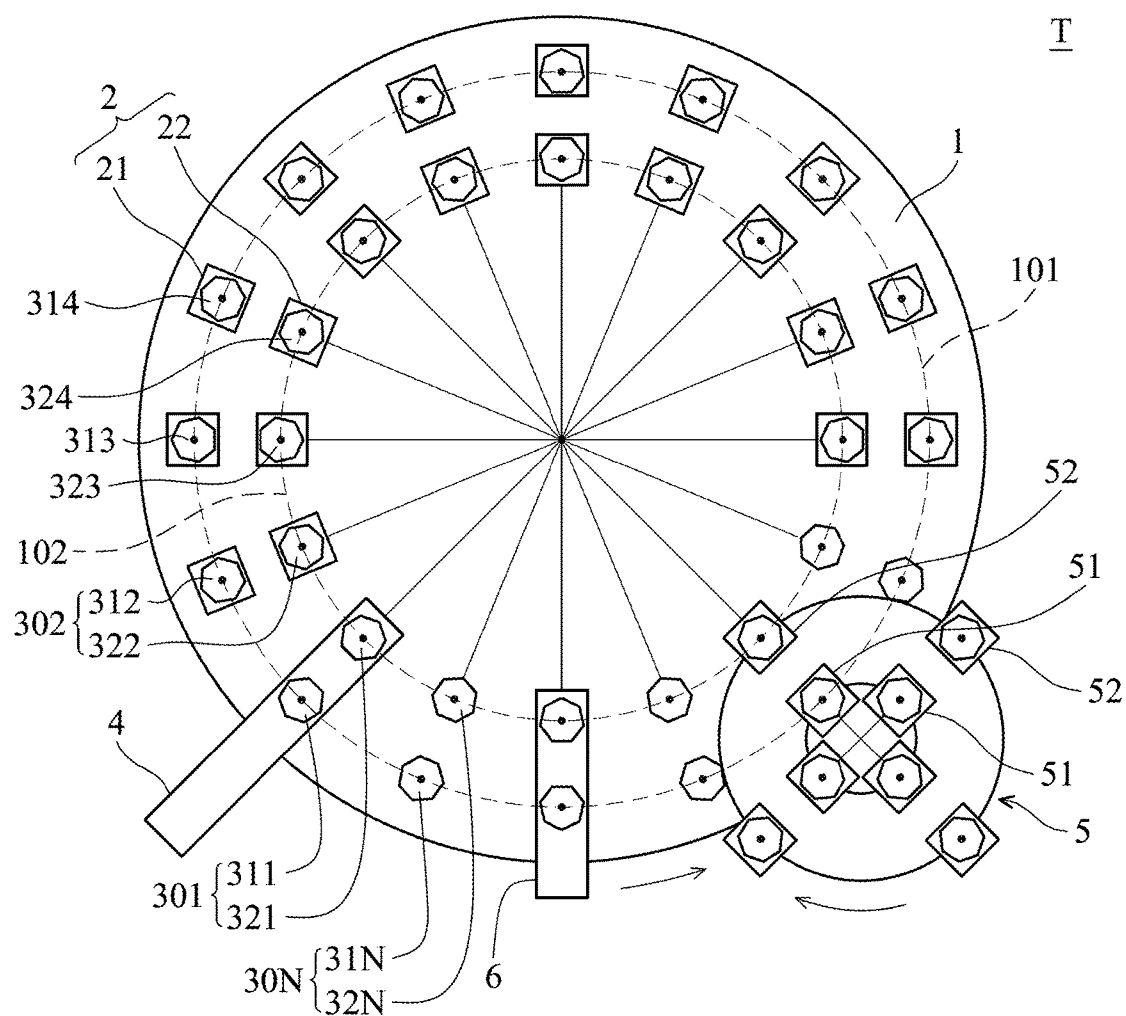
FIG. 1 shows a portion of a turret handler with picker pairs of an embodiment of the invention.

FIG. 1 shows a portion of a turret handler T with picker pairs of an embodiment of the invention, which is provided for testing a plurality of electronic elements C (for example, electronic chips). The turret handler T includes a transmission plate 1, a plurality of outer picker pairs 301~30N, a plurality of sockets 2 and a package carrier 4. Each of the plurality of picker pairs 301~30N includes one of the plurality of outer pickers 311~31N, and one of the plurality of inner pickers 321~32N. For example, the picker pair 301 includes a first outer picker 311 and a first inner picker 321, the picker pair 302 includes a second outer picker 312 and a second inner picker 322, and so on. The picker pairs 301~30N are disposed on the transmission plate 1. The outer pickers 311~31N travel along a first circular path 101. The inner pickers 321~32N travel along a second circular path 102. In this embodiment, the first circular path 101 surrounds the second circular path 102. The first circular path 101 and the second circular path 102 are concentric circles. The sockets 2 include a plurality of first sockets 21 and a plurality of second sockets 22. The first sockets 21 circumferentially correspond to the first circular path 101, the second sockets 22 circumferentially correspond to the second circular path 102. Each first socket 21 corresponds to one second socket 22 along the radial direction. In this embodiment, the first sockets 21 are arranged along the first circular path 101, and the second socket 22 are arranged along the second circular path 102.

In one embodiment, the sockets 2 are unmovable. The picker pairs 301~30N are rotated by the transmission plate 1. The transmission plate 1 moves the outer pickers 311~31N along the first circular path 101, and the transmission plate 1 moves the inner pickers 321~32N along the second circular path 102. The electronic elements C (not shown) are moved by the picker pairs 301~30N to the sockets 2 to be tested.

Figure 2:
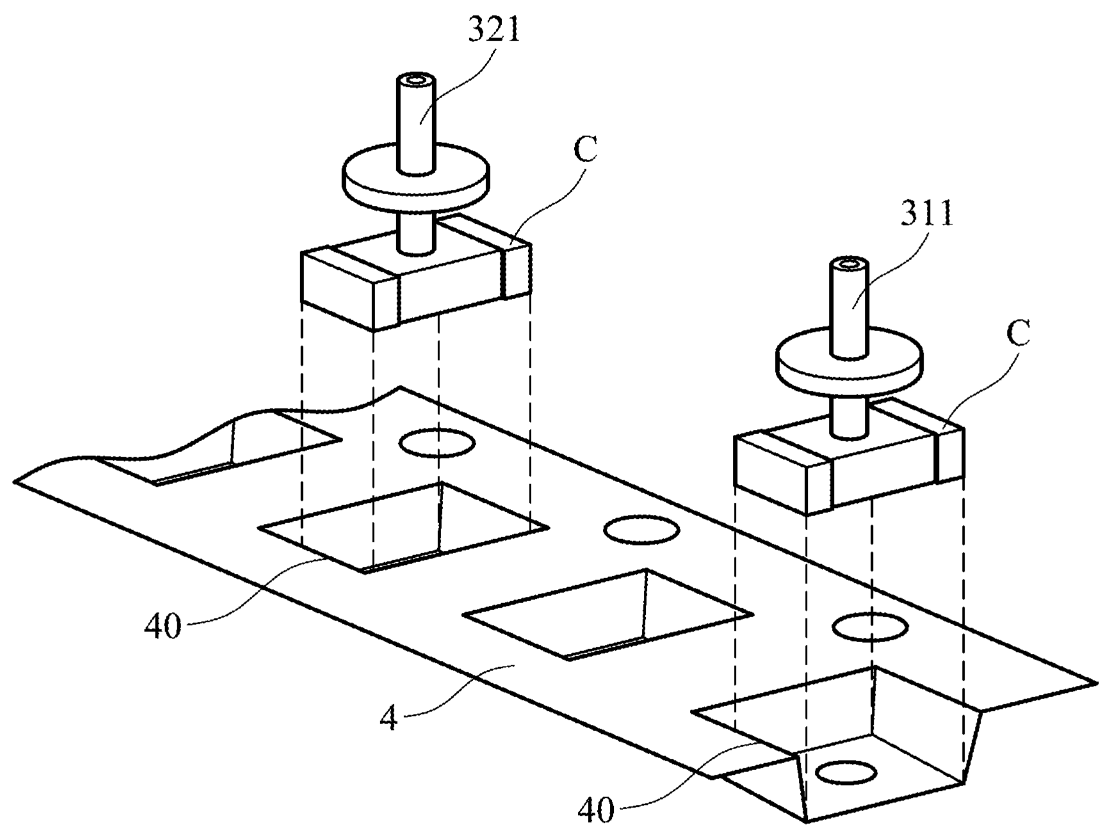
FIG. 2 shows one pair of first and inner pickers putting the two qualified electronic elements in the recesses simultaneously.

With reference to FIG. 2, the package carrier 4 includes a plurality of recesses 40. In a first state, one of the picker pairs 301~30N puts the two qualified electronic elements C in the recesses 40 simultaneously. In one embodiment, the electronic element C can be a chip having leads, a chip having no leads, or another electronic element.

With reference to FIG. 1, in one embodiment, the outer pickers 311~31N and the inner pickers 321~32N are arranged side by side along the radial direction of the first circular path 101.

Figure 3A:
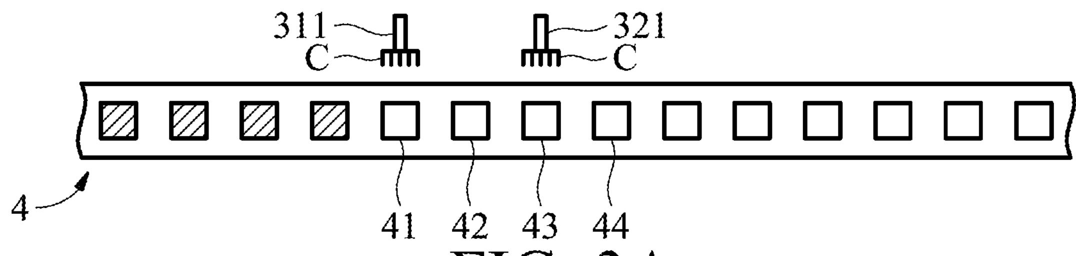
FIGS. 3A, 3B, 3C, 3D and 3E show the electronic elements being placed into the recesses in a first state.
Figure 3B:
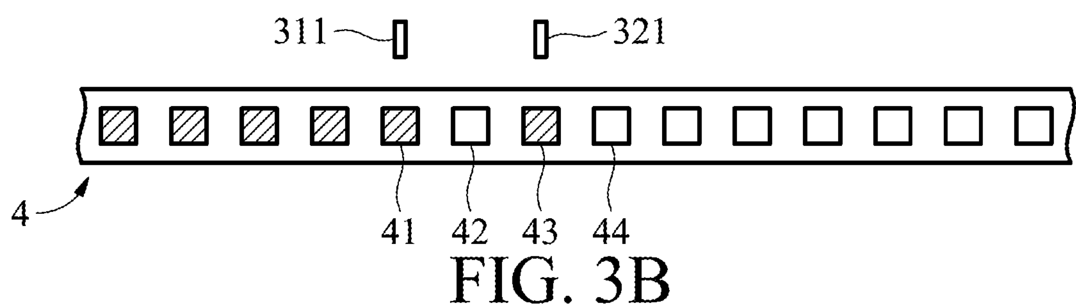
Figure 3C:
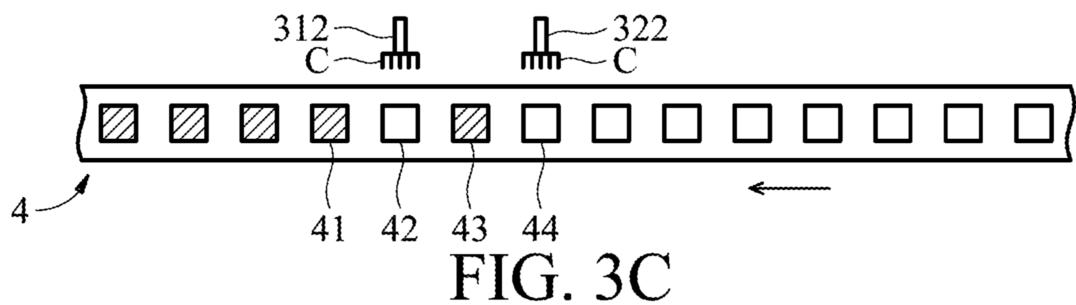
Figure 3D:
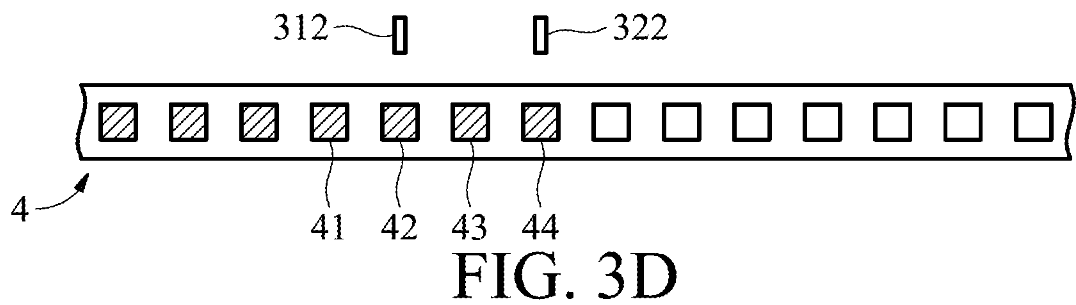
Figure 3E:
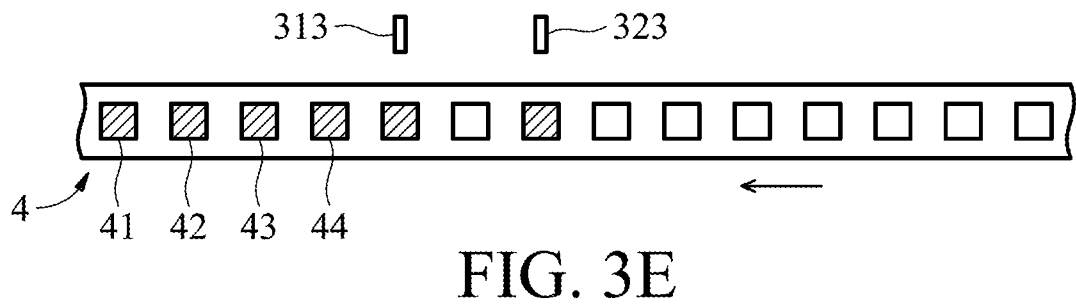

FIGS. 3A~3E show the electronic elements C being placed into the recesses 40 in a first state. In one embodiment, the recesses 40 comprise a first recess 41, a second recess 42, a third recess 43 and a fourth recess 44, which are sequentially arranged on the package carrier 4. Please refer to FIGS. 1 and 3A~3E in the first state, the first outer picker 311, the first inner picker 321, the first recess 41 and the third recess 43 are in placement positions (FIG. 3A). Then, the first outer picker 311 puts one qualified electronic element C into the first recess 41, and the first inner picker 321 puts one qualified electronic element C into the third recess 43 (FIG. 3B). Next, the transmission plate 1 is rotated to make the second outer picker 312 and the second inner picker 322 in the placement positions, and the package carrier 4 is moved to make the second recess 42 and the fourth recess 44 in the placement positions (FIG. 3C). Then, the second outer picker 312 puts one qualified electronic element C into the second recess 42, and the second inner picker 322 puts one qualified electronic element C into the fourth recess 44 (FIG. 3D). Then, the transmission plate 1 keeps rotating, the package carrier 4 keeps moving, and the electronic elements C are continuously placed into the recesses.

Figure 4A:
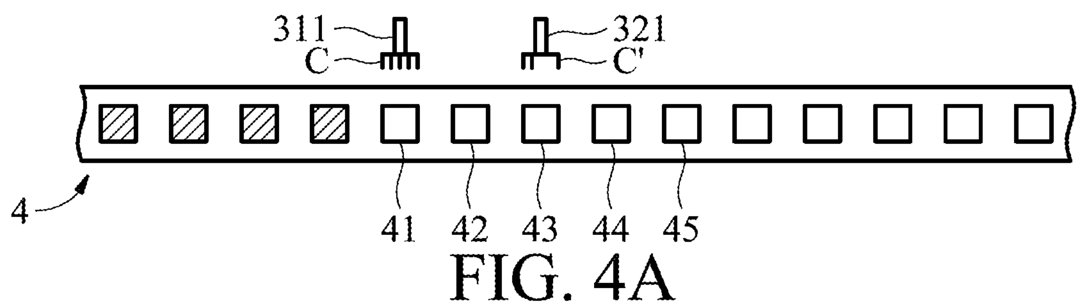
FIGS. 4A, 4B, 4C, and 4D show the electronic elements being placed into the recesses in a second state.
Figure 4B:
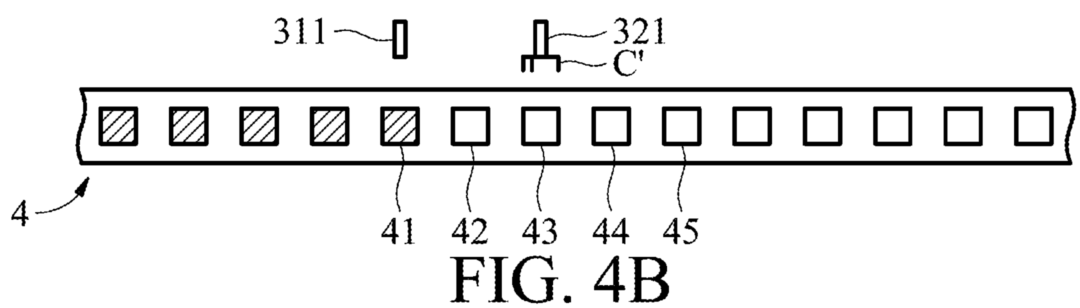
Figure 4C:
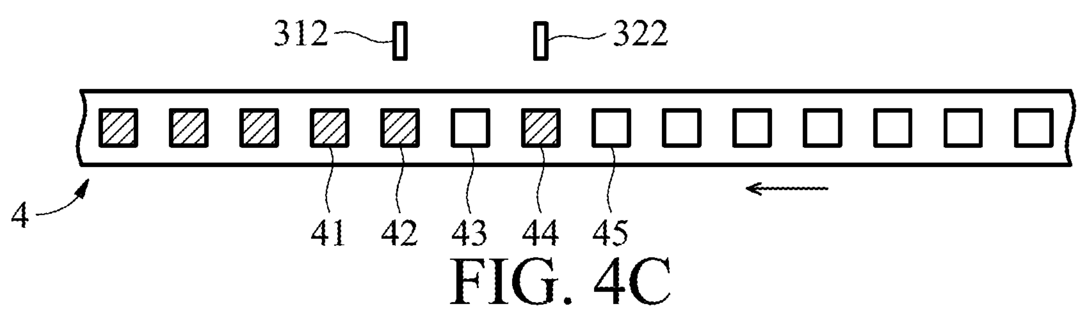
Figure 4D:
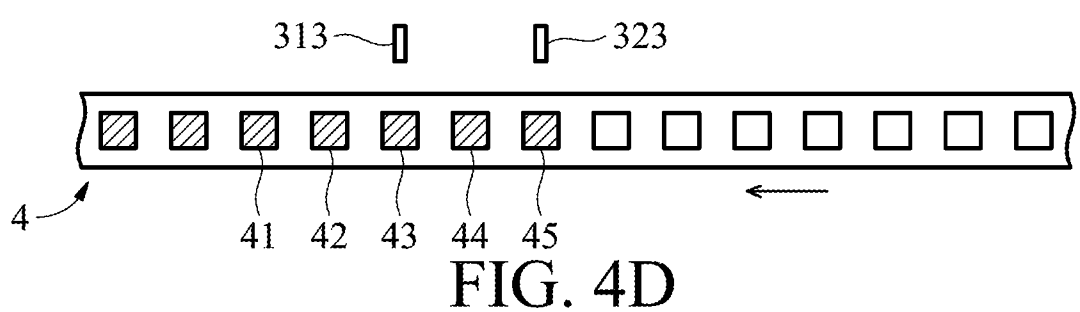

FIGS. 4A~4D show a second state wherein one disqualified electronic element C' held by the first inner picker 321 is detected. The recesses 40 comprise a first recess 41. a second recess 42, a third recess 43, a fourth recess 44 and a fifth recess 45, which are sequentially arranged on the package carrier 4. Please refer to FIGS. 1 and 4A~4D, in the second state, the first outer picker 311, the first inner picker 321, the first recess 41 and the third recess 43 are in placement positions (FIG. 4A). Then, the outer picker 31 puts one qualified electronic element C into the first recess 41, and the first inner picker 321 holds the disqualified electronic element C' (FIG. 4B). In one embodiment, the disqualified electronic element C' held by the first inner picker 321 may be abandoned before the first inner picker 321 is rotated to the placement position or after the first inner picker 321 leaves the placement position. Next, the transmission plate 1 is rotated to make the second outer picker 312 and the second inner picker 322 in the placement positions, and the package carrier 4 is moved to make the second recess 42 and the fourth recess 44 in the placement positions, the second outer picker 312 then puts one qualified electronic element C into the second recess 42, and the second inner picker 322 puts one qualified electronic element into the fourth recess 44 (FIG. 4C). Then the transmission plate 1 is rotated to make the third outer picker 313 and the third inner picker 323 in the placement positions, and the package carrier 4 is moved to make the third recess 43 and the fifth recess 45 in the placement positions, the third outer picker 313 then puts one qualified electronic element C into the third recess 43, and the third inner picker 323 puts one qualified electronic element C into the fifth recess 45 (FIG. 4D). Then, the transmission plate 1 keeps rotating, the package carrier 4 keeps moving, and the electronic elements are continuously placed into the recesses.

Figure 5A:
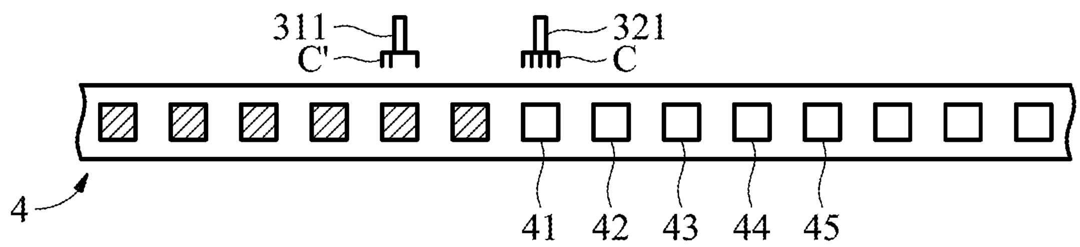
FIGS. 5A, 5B, 5C, 5D, and 5E show the electronic elements being placed into the recesses in a third state.
Figure 5B:
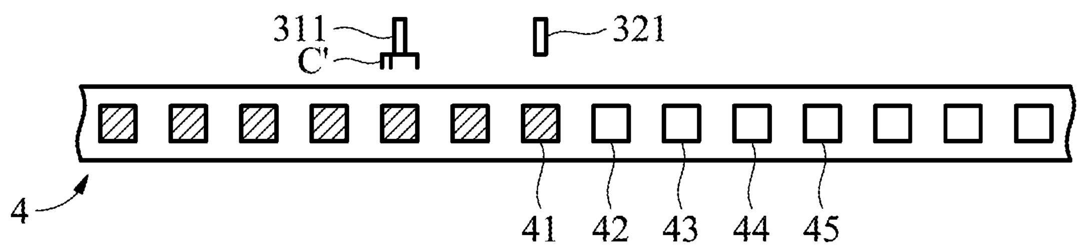
Figure 5C:
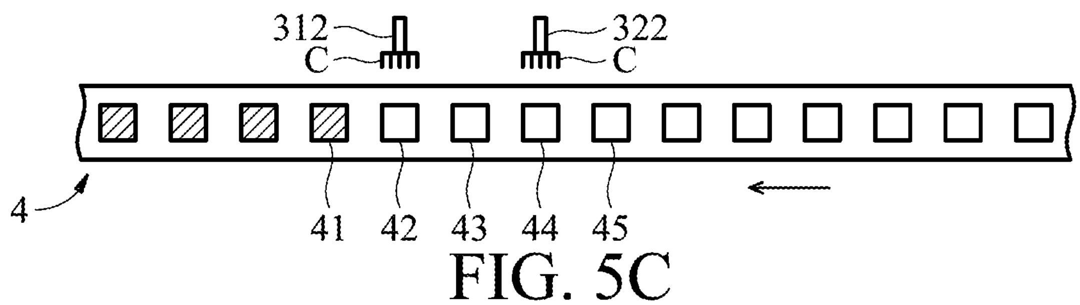
Figure 5D:
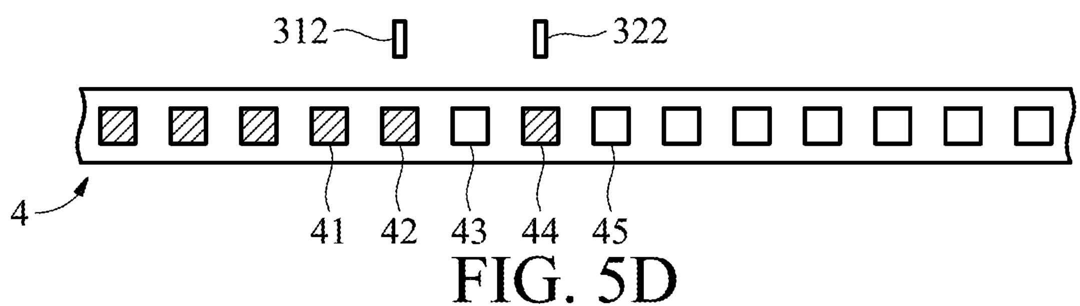
Figure 5E:
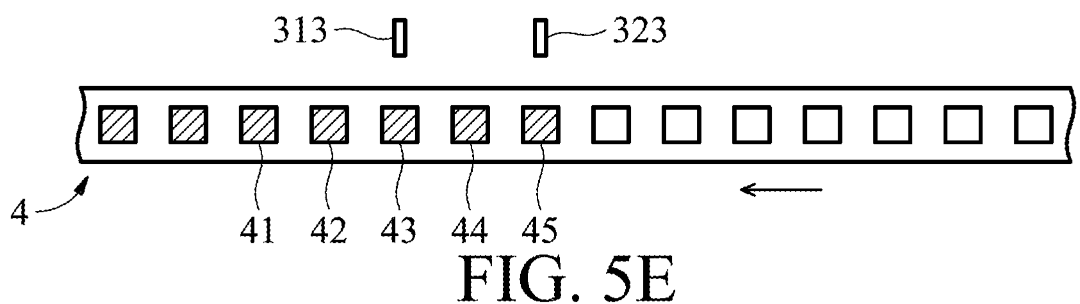

FIGS. 5A~5E show a third state wherein one disqualified electronic element C held by the first outer picker 311 is detected. The recesses 40 comprise a first recess 41, a second recess 42, a third recess 43, a fourth recess 44 and a fifth recess 45, which are sequentially arranged on the package carrier 4. Please refer to FIGS. 1 and 5A~5E, in the third state, due to the disqualified electronic element C' being held by the first outer picker 311, the package carrier 4 moves the first recess 41 in the placement position corresponding to the first inner picker 321 (FIG. 5A). The first outer picker 311 holds the disqualified electronic element C', and the first inner picker 321 puts one qualified electronic element C into the first recess 41 (FIG. 5B). In one embodiment, the disqualified electronic element C' held by the first outer picker 311 is abandoned before entering or after leaving the placement position. Then, the transmission plate 1 is rotated to make the second outer picker 312 and the second inner picker 322 in the placement positions, and the package carrier 4 is moved to make the second recess 42 and the fourth recess 44 in the placement positions (FIG. 5C), the second outer picker 312 then puts one qualified electronic element C into the second recess 42, and the second inner picker 322 puts one qualified electronic element C into the fourth recess 44 (FIG. 5D). Next, the transmission plate 1 is rotated to make the third outer picker 313 and the third inner picker 323 in the placement positions, and the package carrier 4 is moved to make the third recess 43 and the fifth recess 45 in the placement positions, the third outer picker 313 then puts one qualified electronic element C into the third recess 43, and the third inner picker 323 puts one qualified electronic element C into the fifth recess 45 (FIG. 5E). Then, the transmission plate 1 keeps rotating, the package carrier 4 keeps moving, and the electronic elements C are continuously placed into the recesses.

Figure 6A:
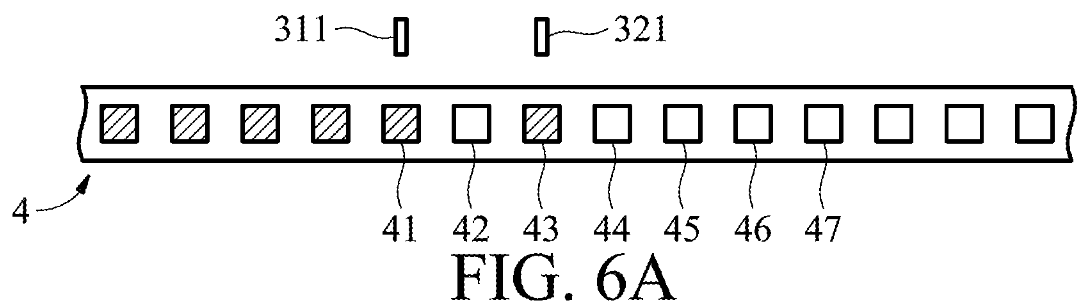
FIGS. 6A, 6B, 6C, and 6D show the electronic elements being placed into the recesses in a fourth state.
Figure 6B:
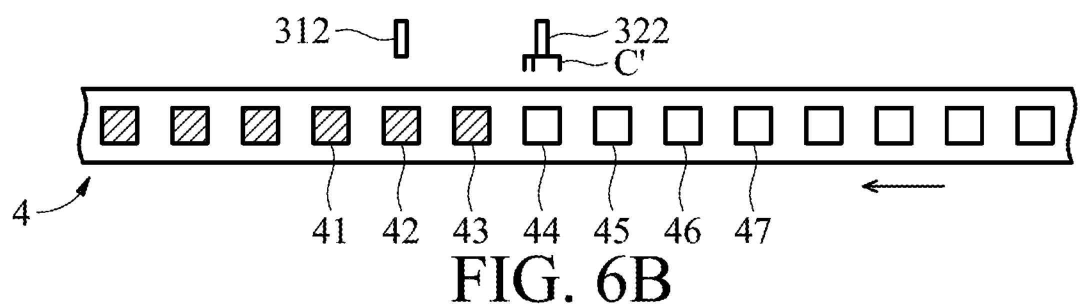
Figure 6C:
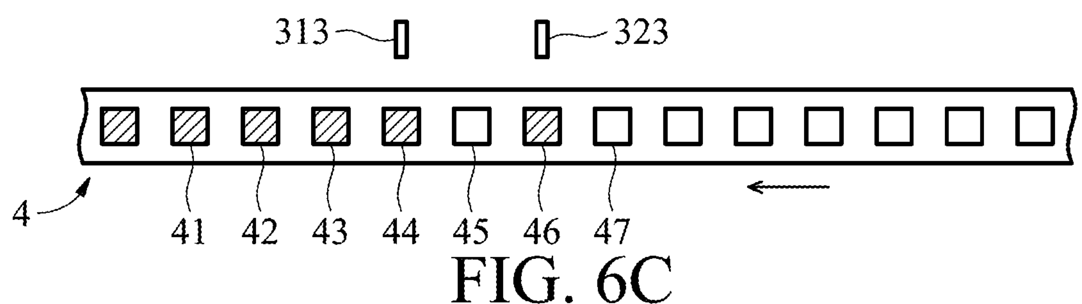
Figure 6D:
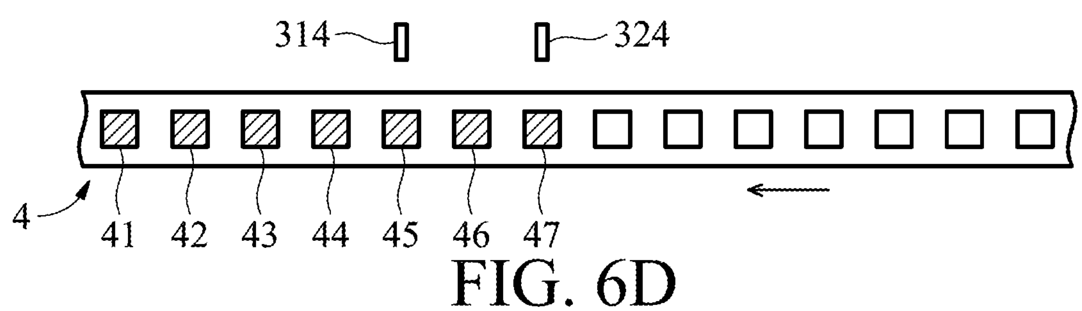

FIGS. 6A~6D show a fourth state wherein one disqualified electronic element C' held by second inner picker 322 is detected, and the first recess 41 and the third recess 43 contain the qualified electronic elements C. The recesses 40 comprise a first recess 41, a second recess 42, a third recess 43, a fourth recess 44, a fifth recess 45, a sixth recess 46 and a seventh recess 47, which are sequentially arranged on the package carrier 4. Please refer to FIGS. 1 and 6A~6D, in this embodiment, the first recess 41 and the third recess 43 receive the qualified electronic elements C held by first outer picker 311 and first inner picker 321 (FIG. 6A). Then the transmission plate 1 is rotated to make the second outer picker 312 and the second inner picker 322 in the placement positions, and the package carrier 4 is moved to make the second recess 42 and the forth recess 44 in the placement positions, the second outer picker 312 puts one qualified electronic element C into the second recess 42, and the second inner picker 322 holds one disqualified electronic element C' (FIG. 6B). In one embodiment, the disqualified electronic element C' held by the second inner picker 322 may be abandoned before entering or after leaving the placement position. Next, the transmission plate 1 is rotated to make the third outer picker 313 and the third inner picker 323 in the placement positions, and the package carrier 4 is moved to make the fourth recess 44 and the sixth recess 46 in the placement positions, the third outer picker 313 then puts one qualified electronic element C into the fourth recess 44, and the third inner picker 323 puts one qualified electronic element C into the sixth recess 46 (FIG. 6C). Next, the transmission plate 1 is rotated to make the fourth outer picker 314 and the fourth inner picker 324 in the placement positions, and the package carrier 4 is moved to make the fifth recess 45 and the seventh recess 47 in the placement positions, the fourth outer picker 314 then puts one qualified electronic element C into the fifth recess 45, and the fourth inner picker 324 puts one qualified electronic element C into the seventh recess 47 (FIG. 6D). Then, the transmission plate 1 keeps rotating, the package carrier 4 keeps moving, and the electronic elements are continuously placed into the recesses.

Figure 7A:
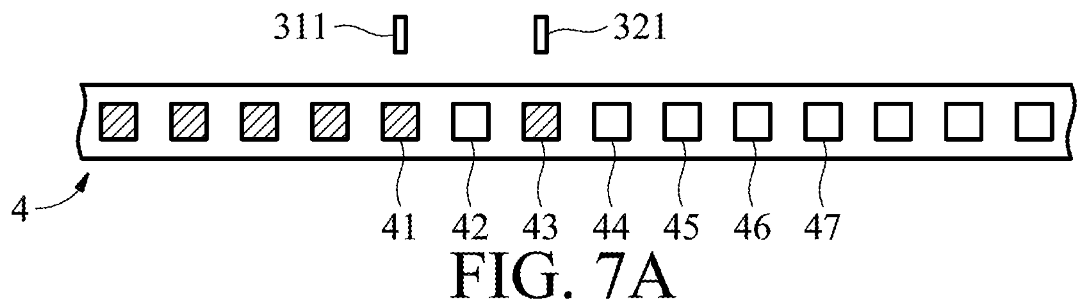
FIGS. 7A, 7B, 7C, and 7D show the electronic elements being placed into the recesses in a fifth state.
Figure 7B:
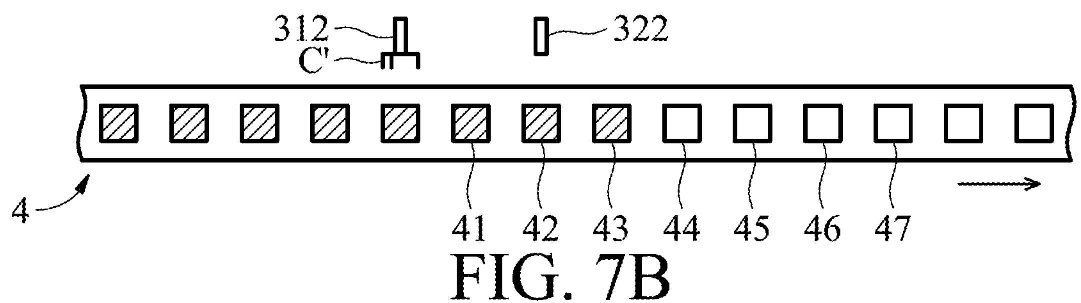
Figure 7C:
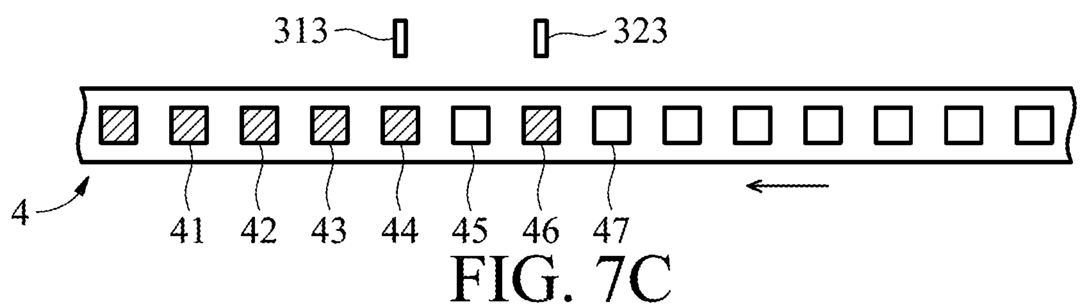
Figure 7D:
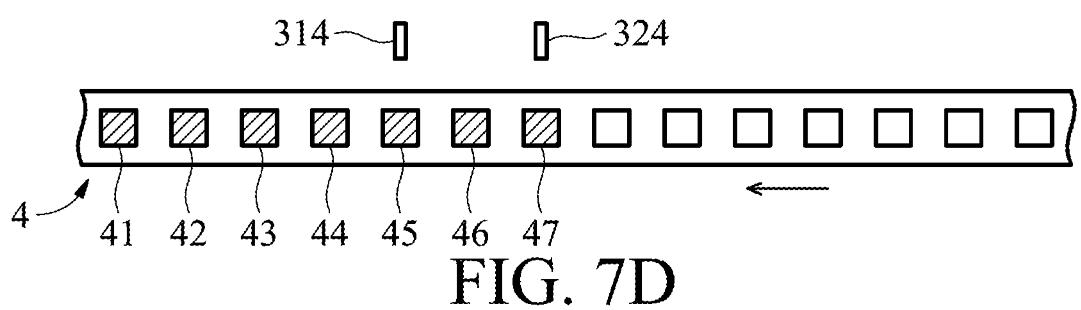
Figure 8A:
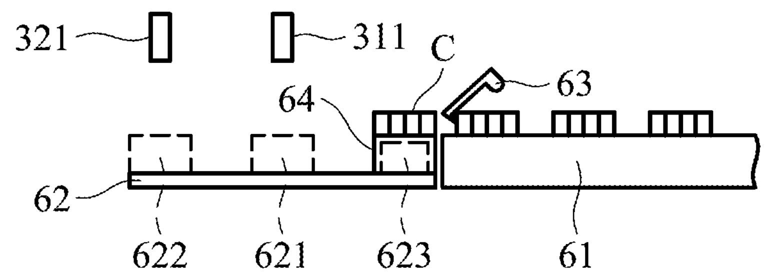
FIGS. 8A, 8B and 8C show the details of a feeding unit of the embodiment of the invention.
Figure 8B:
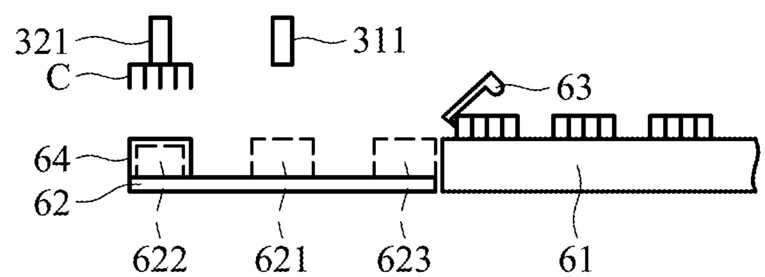
Figure 8C:
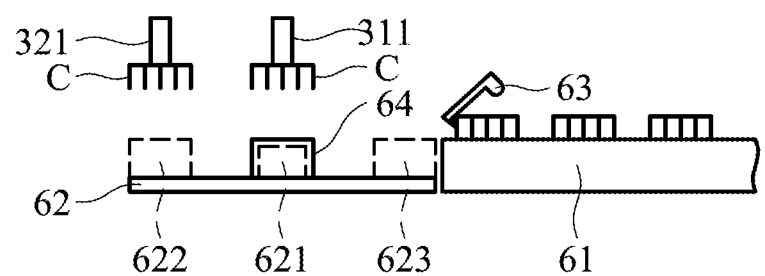

FIGS. 7A~7D show a fifth state wherein one disqualified electronic element C' held by second outer picker 312 is detected, and the first recess 41 and the third recess 43 contain the qualified electronic elements C. The recesses 40 comprise a first recess 41, a second recess 42, a third recess 43, a fourth recess 44, a fifth recess 45, a six recess 46 and a seventh recess 47, which are sequentially arranged on the package carrier 4. Please refer to FIGS. 1 and 7A~7D, in this embodiment, the first recess 41 and the third recess 43 receive the qualified electronic elements C held by first outer picker 311 and first inner picker 321 (FIG. 7A). Then the transmission plate 1 is rotated to make the second outer picker 312 and the second inner picker 322 in the placement positions, and the package carrier 4 is moved backward to make the second recess 42 in the placement position corresponding to second inner picker 322 due to the disqualified electronic element C' is held by the second outer picker 312, then the second inner picker 322 puts one qualified electronic element C into the second recess 42, and the second outer picker 312 holds one disqualified electronic element C' (FIG. 7B). In one embodiment, the disqualified electronic element C' held by the inner picker 312 may be abandoned before entering or after leaving the placement position. Next, the transmission plate 1 is rotated to make the third outer picker 313 and the third inner picker 323 in the placement positions, and the package carrier 4 is moved to make the fourth recess 44 and the sixth recess 46 in the placement positions, the third outer picker 313 then puts one qualified electronic element C into the fourth recess 44, and the third inner picker 323 puts one qualified electronic element C into the sixth recess 46. (FIG. 7C). Next, the transmission plate 1 is rotated to make the fourth outer picker 314 and the fourth inner picker 324 in the placement positions, and the package carrier 4 is moved to make the fifth recess 45 and the seventh recess 47 in the placement positions, the fourth outer picker 314 then puts one qualified electronic element C into the fifth recess 45, and the fourth inner picker 324 puts one qualified electronic element C into the seventh recess 47 (FIG. 7D).Then, the transmission plate 1 keeps rotating, the package carrier 4 keeps moving, and the electronic elements C are continuously placed into the recesses.

Utilizing the radially arranged picker pairs and the radially arranged sockets of the turret handler of the embodiment of the invention, the number of pickers and sockets are increased without substantially changing the design of the turret handler, and the test efficiency of the turret handler is improved. Utilizing the method for placing the electronic elements into the recesses mentioned above, even though one picker holds disqualified electronic element, the radially arranged pickers can smoothly place the qualified electronic elements into the recesses of the package carrier.

With reference to FIG. 1, in one embodiment, the turret handler T further comprises a marking inspection plate 5. The marking inspection plate 5 comprises a plurality of first receiving portions 51 and a plurality of second receiving portions 52. The first receiving portions 51 are circumferentially disposed on the marking inspection plate 5, and the second receiving portions 52 are circumferentially disposed on the marking inspection plate 5. Each first receiving portion 51 radially corresponds to one second receiving portion 52. The outer pickers 311~31N and the inner pickers 321~32N put the non-inspected electronic elements C in the first receiving portions 51 and the second receiving portions 52, and then the outer pickers 311~31N and the inner pickers 321~32N move the inspected electronic elements C to the first sockets 21 and the second sockets 22 after the marking inspection. Utilizing the embodiment of the invention, the inspecting efficiency of the marking inspection plate is also improved without substantially changing the design of the turret handler.

With reference to FIGS. 1, 8A, 8B and 8C, in one embodiment, the turret handler T further comprises a feeding unit 6, wherein the feeding unit 6 comprises a feeding track 61 and a taking portion 62. The taking portion 62 has a first position 621 and a second position 622. The electronic elements C are transmitted to the first position 621 and the second position 622 by the feeding track 61. The outer picker 311~31N (for example, 311) and the inner picker 321~32N (for example, 321) pick up the electronic elements C from the first position 621 and the second position 622 respectively. In one embodiment, the feeding unit 6 further comprises a stopper 63 and a spacer 64. The tacking portion 62 has an initial position 623. When one electronic element C is in the initial position 623, the stopper 63 stops the feeding track 61, and the spacer 64 moves the electronic element C to the first position 621 or the second position 622. Utilizing the embodiment of the invention, the speed of the outer picker 311~31N and the inner picker 321~32N for picking the electronic element C from the taking portion 62 is increased without substantially changing the design of the turret handler.

In one embodiment, a socket gap is formed between the radially arranged first socket 21 and second socket 22, and a recess gap is formed between the neighboring recesses 40, and the socket gap is twice as large as the recess gap. The socket gap is also equal to a picker gap between the radially arranged first outer picker 311 and first inner picker 321. In one embodiment, the socket gap is 4 mm. The value disclosure is not meant to restrict the invention.

In one embodiment, the transmission plate 1 can be replaced by a transmission track, a transmission belt or a transmission gear unit to move the outer pickers 311~31N and inner pickers 321~32N along the first circular path 101 and the second circular path 102. The disclosure is not meant to restrict the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A turret handler with picker pairs, for testing a plurality of electronic elements, comprising:

a plurality of picker pairs configured with a plurality of outer pickers and a plurality of inner pickers, wherein the plurality of outer pickers travel along a first circular path and the plurality of inner pickers travel along a second circular path, and each picker pair includes an outer picker and an inner picker arranged side by side along a radial direction of the first circular path;

a plurality of sockets, comprising a plurality of first sockets and a plurality of second sockets, wherein the first sockets circumferentially correspond to the first circular path, the second sockets circumferentially correspond to the second circular path, each first socket corresponds to one second socket along the radial direction, the electronic elements are moved to the first sockets by the outer pickers to be tested, and the electronic elements are moved to the second sockets by the inner pickers to be tested; and a package carrier, comprising a plurality of recesses, wherein one picker pair in the placement positions puts qualified electronic elements in the recesses, wherein the first circular path and the second circular path are concentric circles.

2. The turret handler with picker pairs as claimed in claim 1, wherein the recesses comprise a first recess, a second recess, a third recess and a fourth recess, which are sequentially arranged on the package carrier, and in a first state, the first and the third recess are in placement positions, a first outer picker puts one qualified electronic element into the first recess, a first inner picker puts one qualified electronic element into the third recess, and then the package carrier is moved to make the second and the fourth recess in the placement positions, a second outer picker then puts one qualified electronic element into the second recess, and a second inner picker puts one qualified electronic element into the fourth recess.

3. The turret handler with picker pairs as claimed in claim 1, wherein the recesses comprise a first recess, a second recess, a third recess, a fourth recess and a fifth recess, which are sequentially arranged on the package carrier, and in a second state, the first and the third recess are in placement positions, a first outer picker puts one qualified electronic element into the first recess, a first inner picker holds one disqualified electronic element, and then the package carrier is moved to make the second and the fourth recess in the placement positions, a second outer picker then puts one qualified electronic element into the second recess, and a second inner picker puts one qualified electronic element into the fourth recess, and then the package carrier is moved to make the third recess and the fifth recess in the placement positions, a third outer picker then puts one qualified electronic element into the third recess, and a third inner picker puts one qualified electronic element into the fifth recess.

4. The turret handler with picker pairs as claimed in claim 1, wherein the recesses comprise a first recess, a second recess, a third recess, a fourth recess and a fifth recess, which are sequentially arranged on the package carrier, and in a third state, the first recess is in a placement position and corresponds to the a first inner picker, a first outer picker holds one disqualified electronic element, and the first inner picker puts one qualified electronic element into the first recess, and then the package carrier is moved to make the second and the fourth recess in the placement positions, a second outer picker then puts one qualified electronic element into the second recess, and a second inner picker puts one qualified electronic element into the fourth recess, and then the package carrier is moved to make the third and the fifth recess in the placement positions, a third outer picker then puts one qualified electronic element into the third recess, and a third inner picker puts one qualified electronic element into the fifth recess.

5. The turret handler with picker pairs as claimed in claim 1, wherein the recesses comprise a first recess, a second recess, a third recess, a fourth recess, a fifth recess, a sixth recess and a seventh recess, which are sequentially arranged on the package carrier, and in a fourth state, a first outer picker and a first inner picker put qualified electronic elements into the first recess and the third recess, then the package carrier is moved to make the second recess in a placement position, a second outer picker puts one qualified electronic element into the second recess, and a second inner picker holds one disqualified electronic element, and then the package carrier is moved to make the fourth and the sixth recess in the placement positions, a third outer picker then puts one qualified electronic element into the fourth recess, and a third inner picker puts one qualified electronic element into the sixth recess, and then the package carrier is moved to make the fifth and the seven recess in the placement positions, a forth outer picker then puts one qualified electronic element into the fifth recess, and a forth inner picker puts one qualified electronic element into the seven recess.

6. The turret handler with picker pairs as claimed in claim 1, wherein the recesses comprise a first recess, a second recess, a third recess, a fourth recess, a fifth recess, a sixth recess and a seventh recess, which are sequentially arranged on the package carrier, and in a fifth state, a first outer picker and a first inner picker put qualified electronic elements into the first recess and the third recess, then the package carrier is moved to make the second recess in a placement position and corresponds to the a second inner picker, the second inner picker puts one qualified electronic element into the second recess, and a second outer picker holds one disqualified electronic element, and then the package carrier is moved to make the fourth and the sixth recess in the placement positions, a third outer picker then puts one qualified electronic element into the fourth recess, and a third inner picker puts one qualified electronic element into the sixth recess, and then the package carrier is moved to make the fifth and the seven recess in the placement positions, a forth outer picker then puts one qualified electronic element into the fifth recess, and a forth inner picker puts one qualified electronic element into the seven recess.

7. The turret handler with picker pairs as claimed in claim 1, further comprising a marking inspection plate, wherein the marking inspection plate comprises a plurality of first receiving portions and a plurality of second receiving portions, the first receiving portions are circumferentially disposed on the marking inspection plate, the second receiving portions are circumferentially disposed on the marking inspection plate, each first receiving portion radially corresponds to one second receiving portion, the outer pickers and the inner pickers put the non-inspected electronic elements in the first receiving portions and the second receiving portions, and then the outer pickers and the inner pickers move the inspected electronic elements to the first sockets and the second sockets after the marking inspection.

8. The turret handler with picker pairs as claimed in claim 1, further comprising a feeding unit, wherein the feeding unit comprises a feeding track and a taking portion, the taking portion has a first position and a second position, and the electronic elements are transmitted to the first position and the second position by the feeding trace, and the outer picker and the inner picker pick up the electronic elements from the first position and the second position respectively.

9. The turret handler with picker pairs as claimed in claim 8, wherein the feeding unit further comprises a stopper and a spacer, the tacking portion has an initial position, and when one electronic element is in the initial position, the stopper stops the feeding track, and the spacer moves the electronic element to the first position or the second position.

10. The turret handler with picker pairs as claimed in claim 1, wherein a socket gap is formed between the radially arranged first socket and second socket, and a recess gap is formed between the neighboring recesses, and the socket gap is twice as large as the recess gap.

11. The turret handler with picker pairs as claimed in claim 1, further comprising a transmission plate, the outer pickers and the inner pickers are disposed on the transmission plate, the transmission plate moves the outer pickers along the first circular path, and the transmission plate moves the inner pickers along the second circular path.

* * * * *